(12) United States Patent
Luo et al.

(10) Patent No.: US 8,536,053 B2
(45) Date of Patent: Sep. 17, 2013

(54) METHOD FOR RESTRICTING LATERAL ENCROACHMENT OF METAL SILICIDE INTO CHANNEL REGION

(75) Inventors: Jun Luo, Beijing (CN); Chao Zhao, Kessel-lo (BE); Huicai Zhong, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 7 days.

(21) Appl. No.: 13/063,922

(22) PCT Filed: Jan. 27, 2011

(86) PCT No.: PCT/CN2011/070698
§ 371 (c)(1),
(2), (4) Date: Mar. 14, 2011

(87) PCT Pub. No.: WO2012/083600
PCT Pub. Date: Jun. 28, 2012

(65) Prior Publication Data
US 2012/0156873 A1 Jun. 21, 2012

(30) Foreign Application Priority Data
Dec. 21, 2010 (CN) .......................... 2010 1 0599252

(51) Int. Cl.
*H01L 21/28* (2006.01)
(52) U.S. Cl.
USPC .................................. 438/660; 257/E21.158
(58) Field of Classification Search
USPC .................. 438/660, 682, 683; 257/E21.158
See application file for complete search history.

(56) References Cited

U.S. PATENT DOCUMENTS

| | | | | |
|---|---|---|---|---|
| 5,686,331 A * | 11/1997 | Song | ............................. | 438/303 |
| 6,063,681 A * | 5/2000 | Son | ................................ | 438/303 |
| 6,660,598 B2 * | 12/2003 | Hanafi et al. | ................... | 438/291 |
| 7,084,025 B2 * | 8/2006 | Phua et al. | ...................... | 438/199 |
| 2005/0212040 A1 | 9/2005 | Hokazono et al. | | |
| 2005/0266664 A1* | 12/2005 | Harrison et al. | .............. | 438/592 |
| 2009/0206406 A1* | 8/2009 | Rachmady et al. | ........... | 257/365 |
| 2009/0302389 A1 | 12/2009 | Lander et al. | | |

FOREIGN PATENT DOCUMENTS

| | | |
|---|---|---|
| CN | 101263594 A | 9/2008 |
| KR | 20070046351 A1 | 5/2007 |
| WO | WO2007/031930 A2 | 3/2007 |

OTHER PUBLICATIONS

PCT International Search Report (Aug. 9, 2011).

* cited by examiner

*Primary Examiner* — Calvin Lee
*Assistant Examiner* — Monica D Harrison
(74) *Attorney, Agent, or Firm* — Goodwin Procter LLP

(57) ABSTRACT

A method for restricting lateral encroachment of the metal silicide into the channel region, comprising: providing a semiconductor substrate, a gate stack being formed on the semiconductor substrate, a source region being formed in the semiconductor on one side of the gate stack, and a drain region being formed in the semiconductor substrate on the other side of the gate stack; forming a sacrificial spacer around the gate stack and on the semiconductor substrate; depositing a metal layer for covering the semiconductor substrate, the gate stack and the sacrificial spacer; performing a thermal treatment on the semiconductor substrate, thereby causing the metal layer to react with the sacrificial spacer and the semiconductor substrate in the source region and the drain region; removing the sacrificial spacer, reaction products of the sacrificial spacer and the metal layer, and a part of the metal layer which does not react with the sacrificial spacer.

15 Claims, 9 Drawing Sheets

US 8,536,053 B2

METHOD FOR RESTRICTING LATERAL ENCROACHMENT OF METAL SILICIDE INTO CHANNEL REGION

CROSS REFERENCE TO RELATED APPLICATIONS

The present application claims priority to PCT Application No. PCT/CN2011/070698, filed Jan. 27, 2011, which claimed priority to Chinese Patent Application No. 201010599252.2, entitled "Method for Forming Metal Silicide," filed Dec. 21, 2010. Both the PCT application and the Chinese application are incorporated herein by reference in their entireties.

FIELD OF THE INVENTION

The present invention relates to the field of semiconductor manufacturing, and particularly relates to a method for restricting the lateral encroachment of the metal silicide into the channel region.

BACKGROUND OF THE INVENTION

With the shrinking of the critical dimension of semiconductor device, the contact resistance of semiconductor device such as MOS field effect transistor to the upper layer interconnect impacts the device's performance more seriously. A conventional method for reducing the contact resistance is to form metal silicide on the contact electrode of the device.

FIGS. 1-3 schematically show a method for forming metal silicide in prior art step by step, taking a MOS field effect transistor for example.

Referring to FIG. 1, a semiconductor substrate 10 is provided. A MOS field effect transistor is formed on the semiconductor substrate 10 which comprises a gate stack 11, a source region 12 in the semiconductor on one side of the gate stack 11, and a drain region 13 in the semiconductor substrate 10 on the other side of the gate stack 11. The gate stack 11 comprises a gate dielectric layer 11a, a gate electrode 11b, and a spacer 11c around the gate dielectric layer 11a and the gate electrode 11b. The gate dielectric layer 11a is generally formed of silicon oxide. The gate electrode 11b is generally formed of polycrystalline silicon. The spacer 11c is generally formed of silicon oxide, silicon nitride or a combination thereof. Afterwards, a metal layer 14 is deposited for covering the semiconductor 10 and the gate stack 11. In order to reduce the formation temperature and produce the metal silicide with lower resistivity, the material of the metal layer 14 is generally Ni-based metals such as Ni, Ni—Pt alloy and so on, so that Ni-based silicide (such as NiSi, NiPtSi, NiCoSi, NiPtCoSi and so on) is produced.

Referring to FIG. 2, a thermal treatment, such as annealing, is performed on the semiconductor substrate 10. The metal layer 14 reacts with the silicon on the surface of the source region 12 and the drain region 13, and the polycrystalline silicon on the surface of the gate electrode 11b, producing metal silicide 14a with low resistivity. The spacer 11c is formed of dielectric material and does not react with the metal layer 14.

Referring to FIG. 3, the part of the metal layer 14, which does not react with the semiconductor substrate 10, is removed. The formation process of metal silicide finishes.

Still referring to FIG. 2 and FIG. 3, during the formation process of the metal silicide 14a, excess metal material of the metal layer 14 on the spacer 11c and the part of the metal layer 14 which does not react with the semiconductor substrate 10 would diffuse laterally, such that the metal silicide 14a on the source region 12 and the drain region 13 encroaches into the region 15 under the spacer 11c, or even into the semiconductor substrate 10 under the gate dielectric layer 11a, which is the channel region of the MOS field effect transistor. It leads to larger gate electrode leakage current, lower reliability and even a short between the source region 12 and the drain region 13, degrading the device performance seriously. As for a MOS field effect transistor formed on a SOI (Silicon On Insulator), because the silicon source itself in the source or drain regions is very limited, the lateral encroachment of metal silicide into the channel is even aggravating.

SUMMARY OF THE INVENTION

One object of the invention is to solve the problem that in prior art the metal silicide encroaches laterally into the channel during the salicide process, thus degrading the performance of device.

In order to achieve the above object, the present invention provides a method for restricting lateral encroachment of the metal silicide into the channel region, comprising: providing a semiconductor substrate, a gate stack being formed on the semiconductor substrate, a source region being formed in the semiconductor on one side of the gate stack, and a drain region being formed in the semiconductor substrate on the other side of the gate stack; forming a sacrificial spacer around the gate stack and on the semiconductor substrate; depositing a metal layer for covering the semiconductor substrate, the gate stack and the sacrificial spacer; performing a thermal treatment on the semiconductor substrate, the metal layer reacting with the sacrificial spacer and the semiconductor substrate in the source region and the drain region; and removing the sacrificial spacer, reaction products of the sacrificial spacer and the metal layer, and a part of the metal layer which does not react with the sacrificial spacer.

Optionally, the semiconductor substrate is silicon substrate, silicon-germanium substrate, III-V compound substrate or silicon on insulator.

Optionally, material of the metal layer is Ti, Co, Ni, Ni—Pt alloy, Ni—Co alloy or Ni—Pt—Co alloy.

Optionally, material of the sacrificial spacer is germanium, stannum, or silicon-germanium.

Optionally, removing the sacrificial spacer and reaction products of the sacrificial spacer and the metal layer is performed by wet chemical etching.

Optionally, removing the part of the metal layer which does not react with the sacrificial spacer is performed by wet chemical etching.

Optionally, the chemical solution for the wet etching is $H_2O_2$, HCl, $H_2SO_4$, $NH_4OH$, $HNO_3$, or any combination thereof.

Optionally, forming the sacrificial spacer around the gate stack and on the semiconductor substrate, comprises: forming a sacrificial layer for covering the semiconductor substrate, the top and the sidewall of the gate stack; etching back the sacrificial layer to remove a part of the sacrificial layer on top of the semiconductor substrate and the gate stack, such that the sacrificial spacer is formed on the sidewall of the gate stack.

Optionally, the gate stack comprises: a gate dielectric layer in a gate-first process; a gate electrode on the gate dielectric layer; and a dielectric spacer around the gate dielectric layer and the gate electrode, the sacrificial spacer being formed on the outer sidewall of the dielectric spacer.

Optionally, the gate stack comprises: a gate dielectric layer in the gate-first process; and a gate electrode on the gate dielectric layer, the sacrificial spacer being formed around the gate dielectric layer and the gate electrode, and after removing the sacrificial spacer, wherein the method further includes: forming a dielectric spacer around the gate dielectric layer and the gate electrode.

Optionally, the gate stack comprises: a dummy gate electrode in a gate-last process; and a dielectric spacer around the dummy gate electrode, the sacrificial spacer being formed on the outer sidewall of the dielectric spacer.

Optionally, the gate stack comprises a dummy gate electrode in a gate-last process, the sacrificial spacer being formed around the dummy gate electrode, and after removing the sacrificial spacer, the method further includes: forming a dielectric spacer around the dummy gate electrode.

Optionally, after the thermal treatment, a part of the metal layer on the sacrificial spacer is partially consumed in the reaction with the sacrificial spacer. Optionally, after the thermal treatment, a part of the metal layer on the sacrificial spacer is wholly consumed in the reaction with the sacrificial spacer.

Compared to the prior art, the present invention has the benefits as what follows:

In the present invention, the method for restricting lateral encroachment of the metal silicide into the channel region of the present invention comprises: forming a sacrificial spacer around the gate stack; depositing a metal layer for covering the semiconductor substrate, the gate stack and the sacrificial spacer; performing a thermal treatment on the semiconductor substrate, the metal layer reacting with the sacrificial spacer and the semiconductor substrate in the source region and the drain region; and removing the sacrificial spacer, the reaction products of the sacrificial spacer and the metal layer, and a part of the metal layer which does not react with the sacrificial spacer. During the thermal treatment, a part of the metal layer on the sacrificial spacer is partially or wholly consumed in the reaction with the sacrificial spacer, restricting or even preventing the lateral encroachment of the metal silicide into the channel region, and improving the performance and reliability of the device.

Furthermore, the present invention is feasible to either gate-first process or gate-last process, having a good feasibility in semiconductor industry.

Besides, in the actual production, the thickness of the sacrificial spacer could be manipulated to let the metal layer on the sacrificial spacer be partially or wholly consumed in the reaction with the sacrificial spacer, so that the lateral encroachment of the metal silicide into channel region is controlled appropriately, and the parasitic series resistance of the source/drain region can be played.

DETAILED DESCRIPTION OF THE EMBODIMENTS

In prior art, the metal silicide encroaches laterally during its salicide process, and encroaches into the region under the spacer or even the channel region, degrading the device performance and reliability.

In the present invention, a method for restricting lateral encroachment of a metal silicide into a channel region comprises: forming a sacrificial spacer around the gate stack; depositing a metal layer for covering the semiconductor substrate, the gate stack and the sacrificial spacer; performing a thermal treatment on the semiconductor substrate, the metal layer reacting with the sacrificial spacer and the semiconductor substrate in the source region and the drain region; and removing the sacrificial spacer, reaction products of the sacrificial spacer and the metal layer, and a part of the metal layer which does not react with the sacrificial spacer. During the thermal treatment, a part of the metal layer on the sacrificial spacer is partially or wholly consumed in the reaction with the sacrificial spacer, restricting or even preventing lateral encroachment of the metal silicide, improving the performance and reliability of the device.

Furthermore, the present invention is feasible to either gate-first process or gate-last process, having a good feasibility in semiconductor industry.

Besides, in the actual production, the thickness of the sacrificial spacer could be manipulated to let the metal layer on the sacrificial spacer be partially or wholly consumed in the reaction with the sacrificial spacer, so that lateral encroachment of the metal silicide is controlled appropriately and the parasitic series resistance of the source/drain region can be played.

Hereunder the present invention will be described in detail with reference to embodiments, in conjunction with the accompanying drawings.

Figure 1:
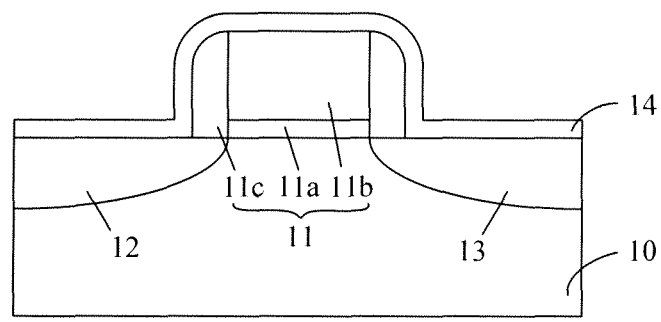
FIGS. 1-3 schematically show a method for forming metal silicide in prior art step by step.
Figure 2:
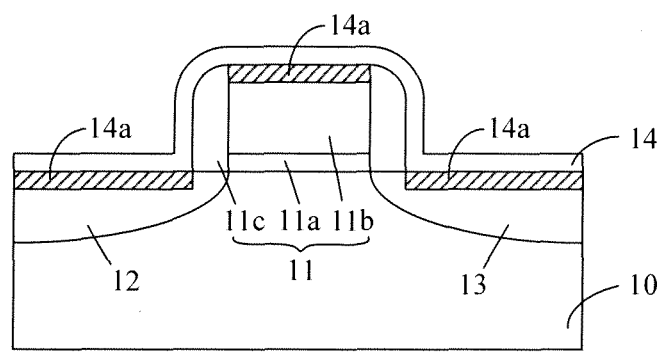
Figure 3:
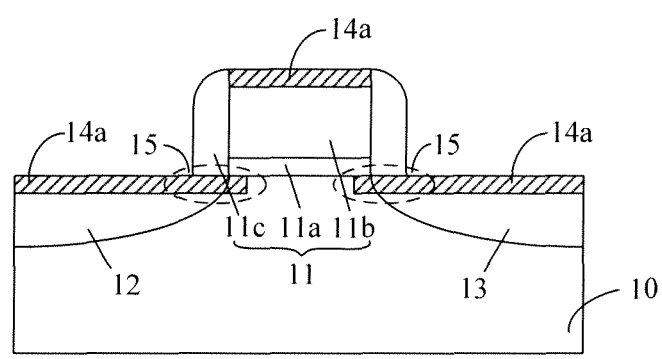
Figure 4:
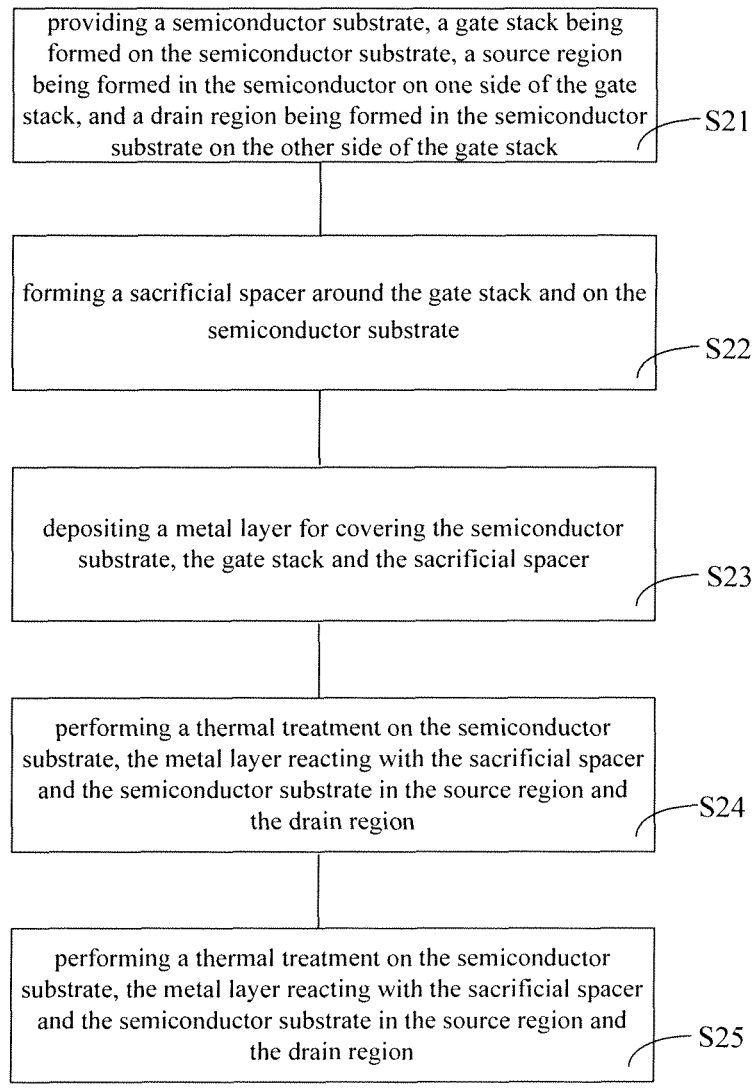
FIG. 4 is a schematic flow chart of a method for restricting lateral encroachment of the metal silicide into the channel region according to an exemplary embodiment of the present invention.

FIG. 4 is a schematic flow chart of a method for restricting lateral encroachment of the metal silicide into the channel region according to an embodiment of the present invention, comprising:

a step S21, providing a semiconductor substrate, a gate stack being formed on the semiconductor substrate, a source region being formed in the semiconductor on one side of the gate stack, and a drain region being formed in the semiconductor substrate on the other side of the gate stack;

a step S22, forming a sacrificial spacer around the gate stack and on the semiconductor substrate;

a step S23, depositing a metal layer for covering the semiconductor substrate, the gate stack and the sacrificial spacer;

a step S24, performing a thermal treatment on the semiconductor substrate, the metal layer reacting with the sacrificial spacer and the semiconductor substrate in the source region and the drain region; and a step S25, removing the sacrificial spacer, reaction products of the sacrificial spacer and the metal layer, and a part of the metal layer which does not react with the sacrificial spacer.

A First Embodiment

FIGS. 5-10 schematically show a method for restricting lateral encroachment of the metal silicide into the channel region step by step according to the first embodiment of the present invention. The first embodiment is a gate-first formation process of a MOS field effect transistor. Of course, the scheme of the present embodiment is also feasible to the salicide process of other types of semiconductor device such as Schottky barrier S/D MOSFET, metallic silicide S/D MOSFET and so on. A detailed description of the first embodiment is provided as following, referring to FIG. 4 and FIG. 5 to FIG. 10.

Figure 5:
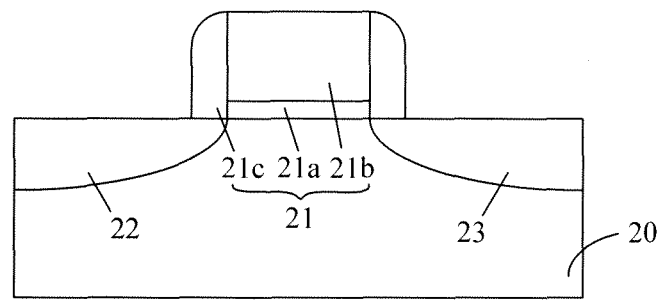
FIGS. 5-10 schematically show a method for restricting lateral encroachment of the metal silicide into the channel region step by step according to a first exemplary embodiment of the present invention.

Referring to FIG. 4 and FIG. 5, the step S21 is executed, and a semiconductor substrate is provided, a gate stack being formed on the semiconductor substrate, a source region being formed in the semiconductor substrate on one side of the gate stack and a drain region being formed in the semiconductor substrate on the other side of the gate stack. Specifically, as illustrated in FIG. 5, a semiconductor substrate 20 is provided. The semiconductor substrate 20 could be silicon substrate, silicon-germanium substrate, III-V compound substrate, silicon on insulator, or other semiconductor substrates known by those ordinary skilled in this art. In the present embodiment, the semiconductor substrate 20 is silicon substrate preferably.

A gate stack 21 is formed on the semiconductor substrate 20. A source region 22 is formed in the semiconductor substrate 20 on one side of the gate stack 21, and a drain region 23 is formed in the semiconductor substrate 20 on the other side of the gate stack 21. In the present embodiment, the gate stack 21 comprises a gate dielectric layer 21a, a gate electrode 21b on the gate dielectric layer 21a, and a dielectric spacer 21c around the gate dielectric layer 21a and the gate electrode 21b. The gate dielectric layer 21a could be formed of silicon oxide. The gate electrode 21b could be formed of polycrystalline silicon. The dielectric spacer 21c could be made of silicon oxide, silicon nitride, or a combination thereof.

Figure 6:
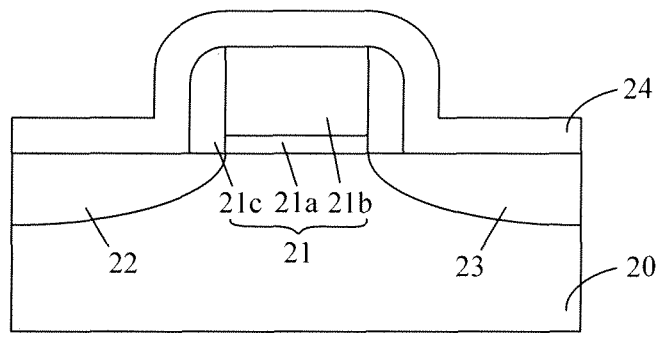
Figure 7:
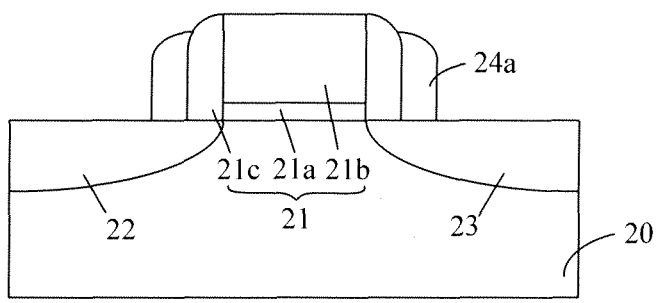

Referring to FIG. 4, FIG. 6 and FIG. 7, the step S22 is executed, and a sacrificial spacer is formed around the gate stack and on the semiconductor substrate.

Specifically, referring to FIG. 6, a sacrificial layer 24 is formed for covering the semiconductor substrate 20, the top and the sidewall of the gate stack 21. The sacrificial layer 24 could be formed of germanium, stannum, silicon-germanium ($Si_{1-x}Ge_x$), or other materials which can react with the deposited metal layer for salicide process. The sacrificial layer 24 could be formed by CVD (Chemical Vapor Deposition) or PVD (Physical Vapor Deposition).

Referring to FIG. 7, the sacrificial layer is etched back, and a part of the sacrificial layer which is on top of the semiconductor substrate 20 and the gate stack 21 is removed, such that a sacrificial spacer 24a is formed on the sidewall of the gate stack 21. Specifically, the sacrificial spacer 24a is on the outer sidewall of the dielectric spacer 21c.

Figure 8:
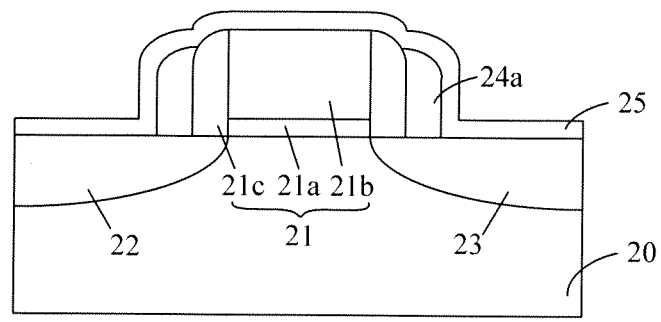

Referring to FIG. 4 and FIG. 8, the step S23 is executed, and a metal layer is deposited for covering the semiconductor substrate, the gate stack and the sacrificial spacer. Specifically, a metal layer 25 is deposited for covering the semiconductor substrate 20, the gate stack 21 and the sacrificial spacer 24a. The metal layer 25 could be formed of Ti, Co, Ni, Ni—Pt alloy, Ni—Co alloy or Ni—Pt—Co alloy. The metal layer 25 could be formed by PVD.

Figure 9:
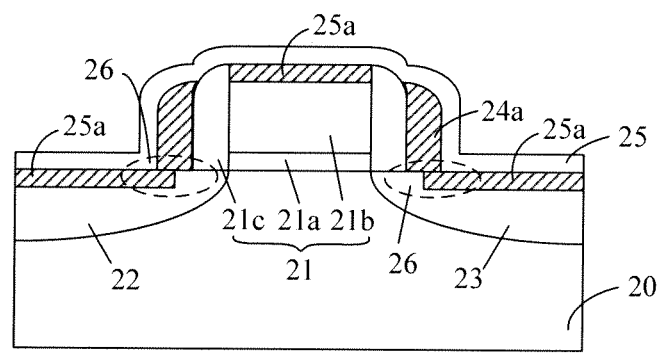

Referring to FIG. 4 and FIG. 9, the step S24 is executed, a thermal treatment is performed on the semiconductor substrate, and the metal layer reacts with the sacrificial spacer and the semiconductor substrate in the source region and the drain region. Specifically, a thermal treatment such as annealing is performed on the semiconductor substrate 20. The metal layer 25 reacts with the sacrificial spacer 24a and the semiconductor substrate 20 in the source region 22 and the drain region 23. A metal silicide 25a is formed on the source region 22, the drain region 23 and the gate electrode 21b.

During the thermal treatment, a part of the metal layer 25 on the sacrificial spacer 24a is consumed in the reaction with the sacrificial spacer 24a, which restricting or even preventing the lateral diffusion of the metal layer 25. In a specific embodiment, the thickness of the metal layer 25 is a fixed value, and by increasing the thickness of the sacrificial spacer 24a, the part of the metal layer 25 on the sacrificial spacer 24a is wholly consumed in the reaction, so that the lateral diffusion of the metal layer 25 is prevented substantially. Or by decreasing the thickness of the sacrificial spacer 24a, the part of the metal layer 25 on the sacrificial spacer 24a is partially consumed in the reaction, so that the metal layer 25 laterally diffuses appropriately, and the metal silicide 25a laterally encroaches into the region 26 under the sacrificial spacer 24a but not into the region under the dielectric spacer 21c, resulting in larger area and lower parasitic series resistance of the metal silicide 25a on the source region 22 and the drain region 23.

Figure 10:
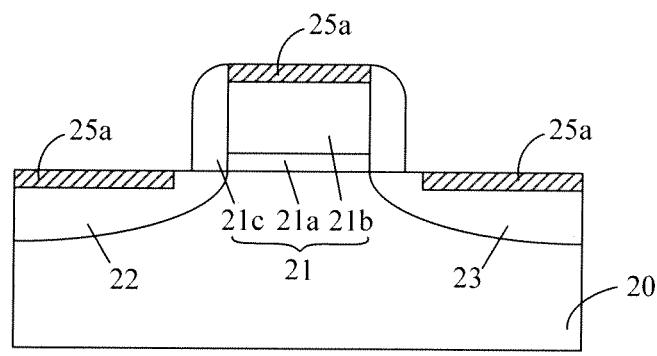

Referring to FIG. 4 and FIG. 10, the step S25 is executed, the sacrificial spacer, the reaction products of the sacrificial spacer and the metal layer, and a part of the metal layer which does not react with the sacrificial spacer are removed. Specifically, the part of the metal layer which does not react with the sacrificial spacer, the sacrificial spacer, and the reaction products of the sacrificial spacer and the metal layer are removed respectively by wet chemical etching. The chemical solution for the wet chemical etching is $H_2O_2$, HCl, $H_2SO_4$, $NH_4OH$, $HNO_3$, or any combination thereof.

So far, the salicide process of metal silicide has been accomplished. Since the excess metal layer is consumed by the sacrificial spacer in the thermal treatment, the lateral encroachment of the metal silicide into the region under the dielectric spacer is restricted or even prevented efficiently. The reliability and performance of the device are improved.

A Second Embodiment

FIGS. 11-16 schematically show a method for restricting lateral encroachment of the metal silicide into the channel region step by step according to the second embodiment of the present invention. The second embodiment is a gate-first formation process of a MOS field effect transistor. Similarly, the scheme of the present embodiment is also feasible to the salicide process of other types of semiconductor device such as Schottky barrier S/D MOSFET, metallic silicide S/D MOSFET and so on.

Figure 11:
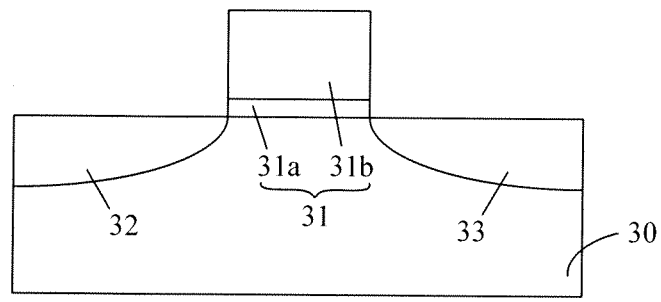
FIGS. 11-16 schematically show a method for restricting lateral encroachment of the metal silicide into the channel region step by step according to a second exemplary embodiment of the present invention.

Referring to FIG. 11, a semiconductor substrate 30 is provided, a gate stack 31 being formed on the semiconductor substrate 30, a source region 32 being formed in the semiconductor substrate 30 on one side of the gate stack 31, and a drain region 33 being formed in the semiconductor substrate 30 on the other side of the gate stack 31. In the present embodiment, the gate stack 31 comprises a gate dielectric layer 31a and a gate electrode 31b on the gate dielectric layer 31a, and no dielectric spacer is formed around the gate stack 31. Please turn to the first embodiment for the materials of the semiconductor substrate 30, the gate dielectric layer 31a and the gate electrode 31b.

Figure 12:
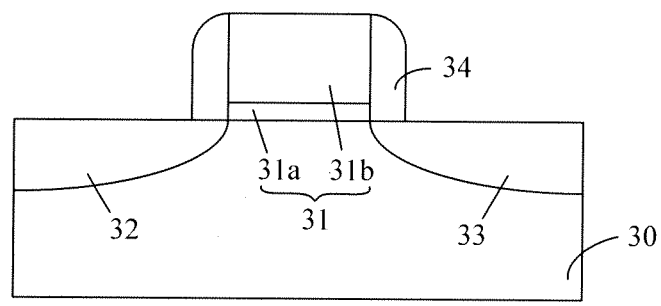

Referring to FIG. 12, a sacrificial spacer 34 is formed around the gate stack 31 and on the semiconductor substrate 30. The material of the sacrificial spacer 34 can react with the metal resulting in the metal silicide when heated, and specifically could be germanium, stannum, or silicon-germanium ($Si_{1-x}Ge_x$).

Figure 13:
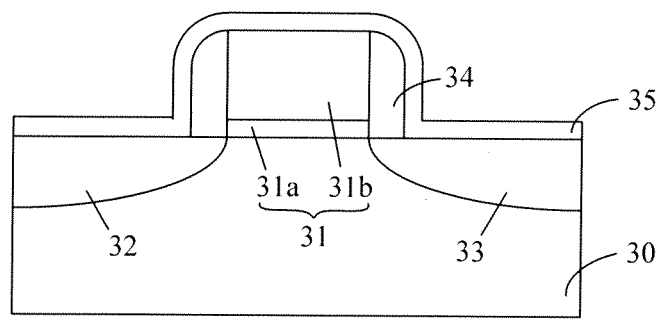

Referring to FIG. 13, a metal layer 35 is deposited for covering the semiconductor substrate 30, the gate stack 31 and the sacrificial spacer 34. The metal layer 35 could be formed of Ti, Co, Ni, Ni—Pt alloy, Ni—Co alloy or Ni—Pt—Co alloy.

Figure 14:
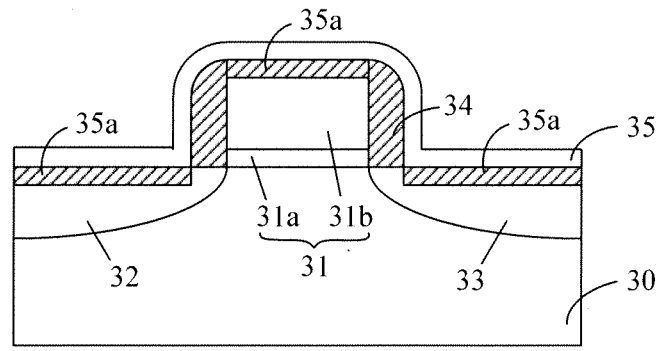

Referring to FIG. 14, a thermal treatment is performed on the semiconductor substrate 30. The metal layer 35 reacts with the source region 32, the drain region 33, the gate electrode 31b and the sacrificial spacer 34, and metal silicide 35a being formed on the source region 32, the drain region 33 and the gate electrode 31b. Because that the sacrificial spacer 34 can react with a part of the metal layer 35 on the sacrificial spacer 34, the lateral encroachment of the metal silicide 35a is restricted or even prevented. Similarly to the first embodiment, by manipulating the thickness of the sacrificial spacer 34, the part of the metal layer 35 on the sacrificial spacer 34 is partially or wholly consumed in the reaction with the sacrificial spacer 34, so that the lateral encroachment of the metal silicide 35a is controlled appropriately and the parasitic series resistance of the source/drain region can be played.

Figure 15:
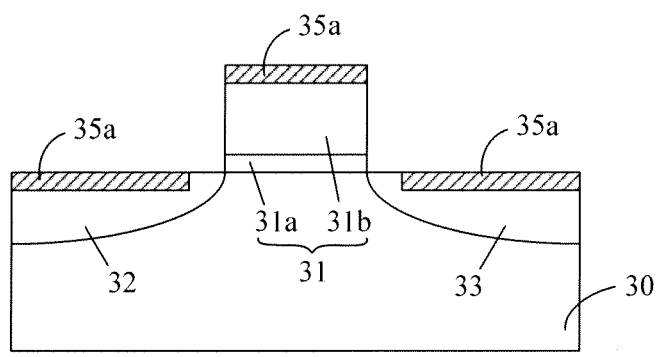

Referring to FIG. 15, the sacrificial spacer, the reaction products of the sacrificial spacer and the metal layer, and a part of the metal layer which does not react with the sacrificial spacer are removed. The removing process could be performed by wet chemical etching, and please turn to the first embodiment for details.

Figure 16:
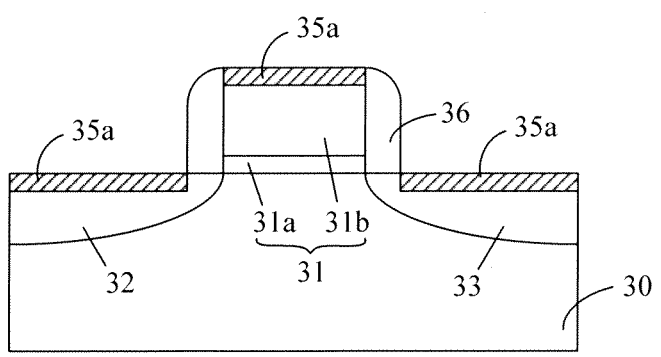

Referring to FIG. 16, after removing the sacrificial spacer, the reaction products of the sacrificial spacer and the metal layer, and the part of the metal layer which does not react with the sacrificial spacer, a dielectric spacer 36 is formed around the gate stack 31.

A Third Embodiment

FIGS. 17-24 schematically show a method for restricting lateral encroachment of the metal silicide into the channel region step by step according to the third embodiment of the present invention. The third embodiment is a gate-last formation process of a MOS field effect transistor. Similarly, the scheme of the present embodiment is also feasible to the salicide process of other types of semiconductor device such as Schottky barrier S/D MOSFET, metallic silicide S/D MOSFET and so on.

Figure 17:
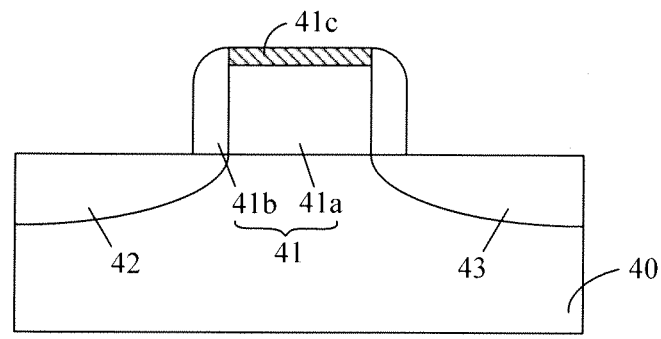
FIGS. 17-24 schematically show a method for restricting lateral encroachment of the metal silicide into the channel region step by step according to a third exemplary embodiment of the present invention.

Referring to FIG. 17, a semiconductor substrate 40 is provided, a gate stack 41 formed on the semiconductor substrate 30, a source region 42 formed in the semiconductor substrate 40 on one side of the gate stack 41 and a drain region 43 formed in the semiconductor substrate 40 on the other side of the gate stack 41. In the present embodiment the gate stack 41 comprises a dummy gate electrode 41a and a dielectric spacer 41b around the dummy gate electrode 41a. The dummy gate electrode 41a is generally formed of polycrystalline silicon. The dielectric spacer 41b is generally formed of silicon oxide, silicon nitride or a combination thereof. In case that metal silicide is also formed on the dummy gate electrode 41a, which would affect the removal process of the dummy gate electrode 41a further, a capping layer 41c is formed on the dummy gate electrode 41a in the present embodiment. The capping layer 41c is formed of dielectric materials such as silicon nitride and so on.

Figure 18:
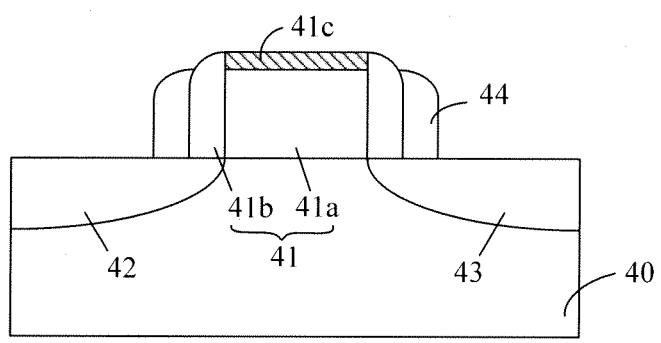

Referring to FIG. 18, a sacrificial spacer 44 is formed around the gate stack 41 and on the semiconductor substrate 40. The material of the sacrificial spacer 44 can react with the deposited metal resulting in the metal silicide when heated, and specifically could be germanium, stannum, or silicon-germanium ($Si_{1-x}Ge_x$).

Figure 19:
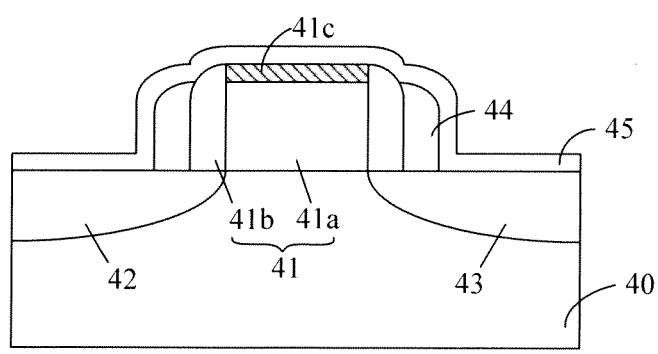

Referring to FIG. 19, a metal layer 45 is deposited for covering the semiconductor 40, the gate stack 41 and the sacrificial spacer 44. The metal layer 45 could be formed of Ti, Co, Ni, Ni—Pt alloy, Ni—Co alloy or Ni—Pt—Co alloy.

Figure 20:
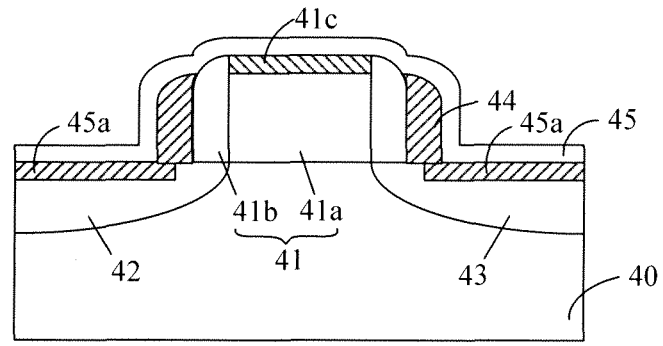

Referring to FIG. 20, a thermal treatment is performed on the semiconductor substrate 40. The metal layer 45 reacts with the source region 42, the drain region 43, and the sacrificial spacer 44, a metal silicide 45a formed on the source region 42 and the drain region 43. Because that the capping layer 41c can't react with the metal layer 45, no metal silicide is formed on the dummy gate electrode 41a. Because the sacrificial spacer 44 reacts with the part of the metal layer 45 on the sacrificial spacer 44, which means the part of the metal layer 45 is consumed in the reaction, the lateral encroachment of the metal silicide 45a is restricted or even prevented. Similarly to the first and the second embodiment, by manipulated the thickness of the sacrificial spacer 44, the part of the metal layer 45 on the sacrificial spacer 44 is partially or wholly consumed in the reaction with the sacrificial spacer 44, so that the lateral encroachment of the metal silicide 45a is controlled appropriately and the parasitic series resistance of the source/drain region can be played.

Figure 21:
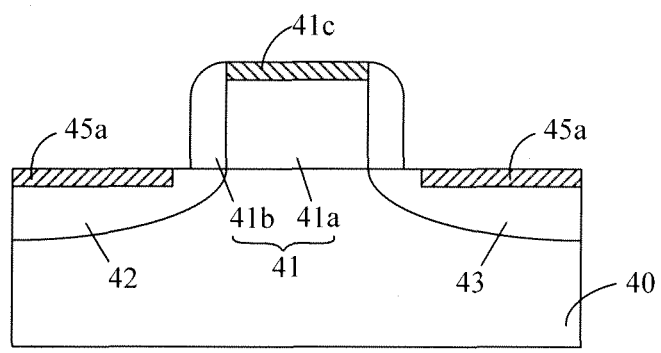

Referring FIG. 21, the sacrificial spacer, the reaction products of the sacrificial spacer, the metal layer and a part of the metal layer which does not react with the sacrificial spacer are removed. The removing process could be performed by wet chemical etching, and please turn to the first embodiment for details.

Figure 22:
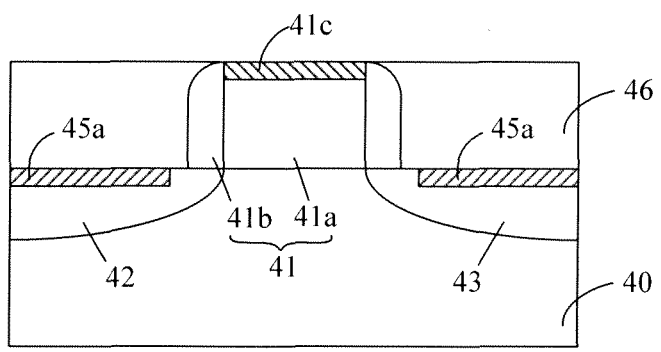

Referring FIG. 22, a dielectric layer 46 is formed on the semiconductor substrate 40 beside the dielectric spacer 41b. The dielectric layer 46 could be formed of silicon oxide or doped silica glass. The dielectric layer 46 could be formed by CVD.

Figure 23:
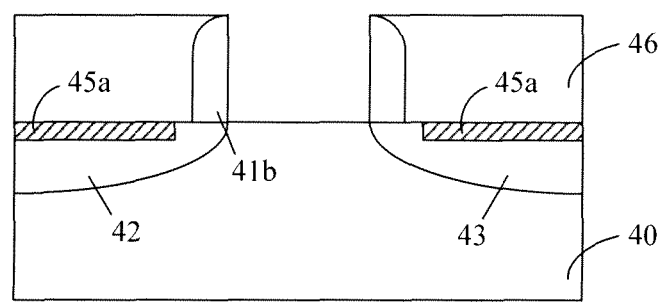

Referring to FIG. 23, the capping layer on the dummy gate electrode and the dummy gate electrode itself are removed respectively, an opening being formed in the dielectric layer 46. The removing process could be performed by wet etching or dry etching.

Figure 24:
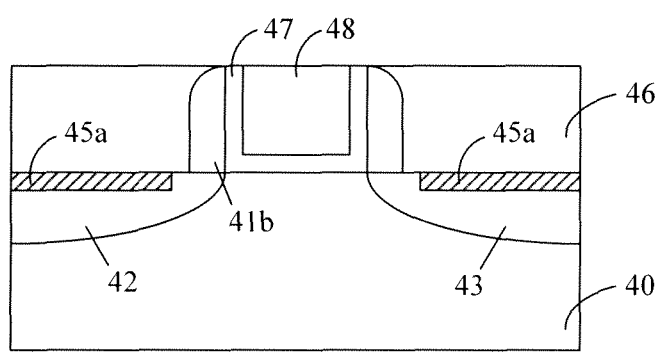

Referring to FIG. 24, the opening is filled with a gate dielectric 47 and a gate electrode 48. In the gate-last process, the gate dielectric 47 is generally formed of high dielectric constant (high-k) material such as $HfO_2$, $La_2O_3$ and so on. The gate electrode 48 is generally formed of metal such as Ti, Ni, Al, and W, and so on.

So far, the gate-last formation process of the MOS field effect transistor has been finished. Of course, in other specific embodiments, the sacrificial spacer could be formed directly around the dummy gate electrode, without forming the dielectric spacer first, and the dielectric spacer could be formed around the dummy gate electrode after the sacrificial spacer is removed.

In summary, in the present invention, the method for restricting lateral encroachment of the silicide into the channel region of the present invention comprises: forming a sacrificial spacer around the gate stack; depositing a metal layer for covering the semiconductor substrate, the gate stack and the sacrificial spacer; performing a thermal treatment on the semiconductor substrate, the metal layer reacting with the sacrificial spacer and the semiconductor substrate in the source region and the drain region; and removing the sacrificial spacer, the reaction products of the sacrificial spacer and the metal layer, and a part of the metal layer which does not react with the sacrificial spacer. During the thermal treatment, the excess metal layer on the sacrificial spacer is consumed in the to reaction with the sacrificial spacer, restricting or even preventing the lateral encroachment of the metal silicide into the channel region, thus improving the performance and reliability of the device.

Furthermore, the present invention is feasible to either gate-first process or gate-last process, having a good feasibility in semiconductor industry.

Besides, in the actual production, the thickness of the sacrificial spacer could be manipulated to let the metal layer on the sacrificial spacer be partially or wholly consumed in the reaction with the sacrificial spacer, so that the lateral encroachment of the metal silicide is controlled appropriately and the parasitic series resistance of the source/drain region can be played.

Although the present invention has been illustrated and described with reference to the preferred embodiments of the present invention, those ordinary skilled in the art shall appreciate that various modifications in form and detail may be made without departing from the spirit and scope of the invention.

What is claimed is:

1. A method for restricting lateral encroachment of a metal silicide into a channel region, comprising:
    providing a semiconductor substrate, a gate stack being formed on the semiconductor substrate, a source region being formed in the semiconductor on one side of the gate stack, and a drain region being formed in the semiconductor substrate on the other side of the gate stack;
    forming a sacrificial spacer around the gate stack and on the semiconductor substrate;
    depositing a metal layer for covering the semiconductor substrate, the gate stack and the sacrificial spacer;
    performing a thermal treatment on the semiconductor substrate, thereby causing the metal layer to react with the sacrificial spacer to produce non-metal-silicide products and causing the metal layer to react with the semiconductor substrate in the source region and the drain region to produce metal-silicide products; and
    removing the sacrificial spacer, the non-metal-silicide products of the sacrificial spacer and the metal layer, and a part of the metal layer which does not react with the sacrificial spacer.

2. The method for restricting lateral encroachment of the metal silicide into the channel region as claimed in claim 1, wherein the semiconductor substrate is a silicon substrate, a silicon-germanium substrate, a III-V compound substrate, or silicon on insulator.

3. The method for restricting lateral encroachment of the metal silicide into the channel region as claimed in claim 1, wherein the material of the metal layer comprises Ti, Co, Ni, Ni—Pt alloy, Ni—Co alloy, or Ni—Pt—Co alloy.

4. The method for restricting lateral encroachment of the metal silicide into the channel region as claimed in claim 3, wherein the material of the sacrificial spacer comprises germanium, stannum, or silicon-germanium.

5. The method for restricting lateral encroachment of the metal silicide into the channel region as claimed in claim 1, wherein removing the sacrificial spacer and the non-metal-silicide products of the sacrificial spacer and the metal layer is performed by wet chemical etching.

6. The method for restricting lateral encroachment of the metal silicide into the channel region as claimed in claim 5, wherein the chemical solution for the wet chemical etching comprises one or more chemicals selected from a group consisting of $H_2O_2$, HCl, $H_2SO_4$, $NH_4OH$, and $HNO_3$.

7. The method for restricting lateral encroachment of the metal silicide into the channel region as claimed in claim 1, wherein removing the part of the metal layer which does not react with the sacrificial spacer is performed by wet chemical etching.

8. The method for restricting lateral encroachment of the metal silicide into the channel region as claimed in claim 7, wherein the chemical solution for the wet chemical etching comprises one or more chemicals selected from a group consisting of $H_2O_2$, HCl, $H_2SO_4$, $NH_4OH$, and $HNO_3$.

9. The method for restricting lateral encroachment of the metal silicide into the channel region as claimed in claim 1, wherein forming the sacrificial spacer around the gate stack and on the semiconductor substrate comprises:
    forming a sacrificial layer for covering the semiconductor substrate, the top and the sidewall of the gate stack; and
    etching back the sacrificial layer to remove a part of the sacrificial layer on top of the semiconductor substrate and the gate stack, such that the sacrificial spacer is formed on the sidewall of the gate stack.

10. The method for restricting lateral encroachment of the metal silicide into the channel region as claimed in claim 1, wherein the gate stack comprises:
    a gate dielectric layer in a gate-first process;
    a gate electrode on the gate dielectric layer; and
    a dielectric spacer around the gate dielectric layer and the gate electrode,
    the sacrificial spacer being formed on the outer sidewall of the dielectric spacer.

11. The method for restricting lateral encroachment of the metal silicide into the channel region as claimed in claim 1, wherein the gate stack comprises:
    a gate dielectric layer in the gate-first process; and
    a gate electrode on the gate dielectric layer,
    the sacrificial spacer being formed around the gate dielectric layer and the gate electrode, and after removing the sacrificial spacer, the method further includes:
    forming a dielectric spacer around the gate dielectric layer and the gate electrode.

12. The method for restricting lateral encroachment of the metal silicide into the channel region as claimed in claim 1, wherein the gate stack comprises:
    a dummy gate electrode in a gate-last process; and
    a dielectric spacer around the dummy gate electrode,
    the sacrificial spacer being formed on the outer sidewall of the dielectric spacer.

13. The method for restricting lateral encroachment of the metal silicide into the channel region as claimed in claim 1, wherein the gate stack comprises a dummy gate electrode in a gate-last process, the sacrificial spacer being formed around the dummy gate electrode, and after removing the sacrificial spacer, the method further includes:
    forming a dielectric spacer around the dummy gate electrode.

14. The method for restricting lateral encroachment of the metal silicide into the channel region as claimed in claim 1, after the thermal treatment, a part of the metal layer on the sacrificial spacer is partially consumed in the reaction with the sacrificial spacer.

15. The method for restricting lateral encroachment of the metal silicide into the channel region as claimed in claim 1, wherein, after the thermal treatment, a part of the metal layer on the sacrificial spacer is wholly consumed in the reaction with the sacrificial spacer.

* * * * *